United States Patent [19]

Schram et al.

[11] Patent Number: 4,871,580
[45] Date of Patent: Oct. 3, 1989

[54] METHOD OF TREATING SURFACES OF SUBSTRATES WITH THE AID OF A PLASMA

[75] Inventors: Daniel C. Schram; Gerardus M. W. Kroesen, both of MB Eindhoven, Netherlands

[73] Assignee: Faculty of Physics Eidhoven University of Technology, Eindhoven, Netherlands

[21] Appl. No.: 206,181

[22] Filed: Jun. 13, 1988

[30] Foreign Application Priority Data

Jun. 30, 1987 [NL] Netherlands .......................... 8701530

[51] Int. Cl.$^4$ .............................................. B05D 3/06
[52] U.S. Cl. ......................................... 427/38; 427/47
[58] Field of Search .................................. 427/38, 47

[56] References Cited
PUBLICATIONS

Plasma-Assisted Chemical Vapor Deposition Processes and their Semiconductor Application, Thin Solid Films, 113 (1984) 135–149.

A New Approach of Plasma Deposition, G. M. W. Kroesen et al., ISPC-7 Conference, Jul. 1985, pp. 698–703.

Physics of Plasma Etching and Plasma Deposition, D. C. Schram et al., pp. 181–187, SASP-Proceedings, 1986.

Primary Examiner—Bernard Pianalto
Attorney, Agent, or Firm—Rosen, Dainow & Jacobs

[57] ABSTRACT

A method of treating substrate surfaces with the aid of a plasma such as etching, deposition etc. In the practice of the method, the plasma flows from its place of generation to the treatment-chamber, and in which method the plasma-generator is flushed through with a flushing gas. Preferably, and firstly after the flushing gas has passed the cathodes, the reactant is fed to the plasma-generator. The invention includes the reactor necessary for carrying out the method.

19 Claims, 4 Drawing Sheets

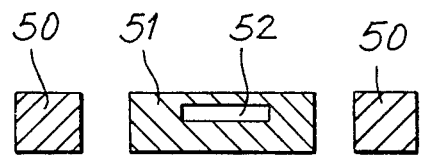
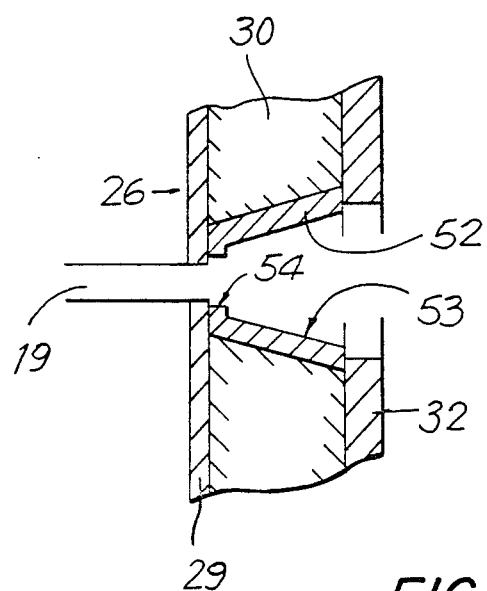

METHOD OF TREATING SURFACES OF SUBSTRATES WITH THE AID OF A PLASMA

The invention relates to a method of treating the surfaces of substrates with the aid of a plasma in which a plasma is generated in at least one plasma-generator connected via at least one plasma-inlet to a plasma treatment-chamber in which the plasma pressure is lower than that in the plasma-generator and through which a stream of plasma flows from the said generator to the said treatment-chamber, in which the said plasma-generator is connected to at least one inlet for a reactant and in which the substrate to be treated can form part of at least one extra discharge. The term plasma-generator as used herein is to be construed as meaning the part where the plasma is generated and the plasma-treatment chamber is to be construed as meaning the part where the surface-treatment takes place. Treatment of substrate surfaces with the aid of a plasma as described herein is to be construed as meaning the processes of plasma-etching, plasma-deposition, plasma-polymerisation or plasma-modification; that is to say the application of a layer of material onto, or removal of a layer or material from, the substrate or the modification of the surface structure of the substrate using a plasma. Such a method is known from the proceedings of the ISPC-VII conference (Eindhoven. 1985. pages 698–703) and from the SASP proceedings (Oberdraun, Austria. 1986. pages 181–187). According to this known method as disclosed in these publications, it is only suitable for plasma deposition with the aid of gaslike reactants; plasma production and surface treatment is spatially achieved insofar that the plasma in the reactant to be used is generated in a cascade-arc whereafter it is transported to the substrate to be treated through supersonic expansion in a vacuum system in the form of strongly flowing plasma-jet, and which substrate can form part of an extra discharge in order to increase the energy of the reactive plasma particles.

In such a method and with the exception of a cascade-arc, the plasma can be generated in a number of different manners according to the known technique, such as by capacitively or inductively connected radio-frequency (RF) fields, microwaves or other direct-current (DC) or alternating-current (AC) arcs or discharges.

The practice of the method described in the quoted publications is accompanied by a number of problems. Firstly through direct injection of a reactive gas-mixture in the plasma-generator, the plasma becomes more contaminated in the cases where cathodes are used for high-temperature plasma generation (temperatures higher than 2000° Kelvin for example). In such circumstances these cathodes react undesirably with reactive atoms (carbon, halogens and oxygen for example) originating from the reactant and are accompanied by the formation of compounds which are a gas, gaslike, vaporisations or sublimations which contaminate the plasma and subject the cathodes to wear. Secondly, the presence of molecules (or particles) of electrically-conducting solid materials (such as wolfram or graphite) used for cathodes is undesirable in the surface treatment process. The disadvantage here is that in the main, the heat developed causes the cathodes to partially melt and vaporise so that the plasma is contaminated even further.

Thirdly, the methods described in the quoted publications are suitable for the processing of other reactants of gas-like form which is objectionable if the surface treatment is required to be carried out with the aid of a material that is available only in a liquid or solid form. Fourthly the first quoted publication (from a reference therein and as implied in the second publication) the aperture in the anode of the arc through which the plasma is extracted needs to have a diameter (1 mm. in the publication) that is smaller than the plasma-channel (4 mm.) through which a so-called sonic-nozzle exists and which can lead to an unexpected stagnation in the flow resulting in deposition of material onto undesirable places.

Fifthly, from the publications it appears that the heat-load imposed on the substrates can only be influenced by essentially changing the energy and the density ratio of the active plasma particles; a process which is disadvantageous in itself because the quality of the surface-treatment is also essentially changed (the quality of the deposited layer in the case of plasma-deposition for example). The quoted influence (mainly lessening) of the heat-load is of importance with substrates which can support only a limited degree of heat.

Sixthly, when employing the method described in the publications the material efficiency, i.e. the fraction of the supplemented quantity of reactant which also actually arrives on the required place (in this case the substrate) is uninfluenced.

The object of the invention is to provide a method and a reactor therefor operating according to the quoted principle and which does not exhibit these disadvantages.

According to the invention, the first objection can be obviated by flushing the plasma-generator through with a flushing-gas. Preferably, a gas-like or liquid reactant is first fed (upstream) in the plasma-generator after the flushing-gas has passed the cathodes(s). The term flushing-gas used herein is to be construed as meaning a gas free of fragments which could react undesirably with parts of the plasma-generator. In particular, the plasma-generator cathode(s) need to be protected against the penetrative effects of reacting fragments of the molecules from which the flushing-gas is composed. According to the invention, the effectiveness of this measure can still be increased by feeding the flushing-gas through the plasma-generator at a rate of at least 1 meter/sec. although preferably at a rate of 10 meter/sec. with the pressure in the plasma-generator greater than 0.1 bar and through which back-diffusion of, or parts of, the reactant to the cathode(s) is strongly retarded or even prevented.

According to the invention, the secondly quoted objection can be removed if the temperature of the cathode(s) is maintained below the cathode material melting point during operation. In a reactor according to the invention and in which the method according thereto is employed, prevention of cathode melting can be achieved by manufacturing the cathode(s) from a material with a high electron-emission factor and preferably an alloy of 0.1 to 10% thorium in tungsten. A known disadvantage of using the materials quoted earlier herein, and namely the disadvantage accruing through slow segregation of one of the material components to the treated surface followed by vaporisation, does not play a significant role in the practice of the method according to the invention. This is because the ratio between the quantity of vaporised cathode-material and the supplemented quantity of reactant is very small (smaller than $1:10^9$ for example) which, in combination with a possibly greater gas-efficiency, only delivers a very minimum quantity of contaminant to the surface of the substrate to be treated (less than 1 billionth part for example).

According to the invention and in the case of the use of a liquid reactant, the thirdly quoted objection can be removed by injecting this type of reactant through the wall of the plasma-generator via a single aperture having a diameter of 0.0001 to 0.5 mm. but preferably 0.0005 to 0.1 mm. In order to counter premature vapourisation, the liquid pressure at the aperture is preferably greater than the pressure in the plasma-generator. If the liquid reactant has already been vaporised before it reaches the plasma in the plasma-generator then here there is a question of injection of a gas-like reactant. According to the invention, with the use of reactants of solid form, the gas-phase can be gone over to by means of at least one discharge being present in the plasma treatment-chamber and/or the plasma-generator. The reactant would then be subjected to bombardment by reactive particles (electron, ions) with higher energy (200 electron-volts for example) and through which the reactant will vaporise or sublimate. Once in the gas-phase it will be transported to the substrate to be treated by the flushing-gas at a very fast rate and with a large yield.

According to the invention the fourth objection can be removed by geometrically arranging the plasma-generator(s) and the plasma inlet(s) in a reactor such that when viewed in the direction-of-flow no sudden restriction of the channel(s) arises. In this manner stagnation of the flow and deposition of the material in undesirable places is prevented. Preferably the diameter of the channel formed by the plasma-generator(s) and the inlet(s) should gradually taper decreasingly when viewed in the direction of flow. The only possible general objections now still clinging to the solutions such as the fact that the pressure at the end of the plasma-generator is relatively fairly-low and could lead to an undesirably high temperature and spatial expansion of the plasma are removed by a specially constructed plasma-generator which either removes, or is insensitive to, the effects causing such objections.

According to the invention the fifthly quoted objection is removed if the rate at which the plasma-treatment chamber is pumped out is made adjustable between zero and 100000 liters/sec., but preferably between 50 and 1000 liters/sec. This can be achieved by fitting a (infinitely-variable or step-by -step) flow-regulating valve in the pump pipeline for example. The resulting plasma jet can now be varied by a diffusion process related to the diameter of the plasma jet itself together with the rate at which the plasma particles are transported to the substrate to be treated thus implying that the density ratio and the energies of the said particles hardly change. This results in the imposition of a regulatable particle-bundle-loading of the said substrate of which the deposited quantity of particles (and thus the energy also) can be set per unit of surface-area without actually changing the other experimental parameters.

According to the invention, the sixth objection can be removed if the diameter of the plasma-generator generated plasma-jet is actively influenced. The term actively-influenced in this context is to be construed as meaning the influencing of the process by means other than by varying the pump speed. If the material efficiency needs to be reduced then, according to the invention, such influence should be exercised preferably by directing the already quoted plasma-jet through a "skimmer". If on the other hand the efficiency needs to be increased, then the quoted influence is preferably exercised by setting up a magnetic-field. A skimmer cuts a part of the quoted plasma-jet as it were such that the other part of the jet does not come into contact with the substrate to be treated. As opposed to this, a magnetic field holds the reactive (particularly the charged) plasma-particles together and increases the intensity of the plasma-jet which is coupled in this case to the decreasing diameter of the plasma-jet.

In the interests of good order it needs to be commented here that the previously quoted supplementation of the reactant to the plasma-generator can take place at any arbitrary place in the plasma-generator thus also at the extreme end and in this case at the plasma-inlet.

According to the invention the temperature of the substrate to be treated can be set to a value between 70° and 1500° Kelvin and preferably between 273° and 1000° Kelvin. Each concrete process for surface-treatment to which the method according to the invention is applied has its own optimal temperature and through which the process runs its course in the most desirable manner.

The invention is now further to be described with reference to drawings of an embodiment hereof and a constructional drawings of a reactor according to the invention in which:

BRIEF DESCRIPTION OF THE DRAWINGS

FIG. 5 shows how reactants in a solid form can be subjected to a discharge which vapourises, sublimates or sputters the material.

FIG. 6 shows the manner in which a nozzle can be designed to prevent flow stagnation arising.

DETAILED DESCRIPTION OF THE DRAWINGS

Figure 1:
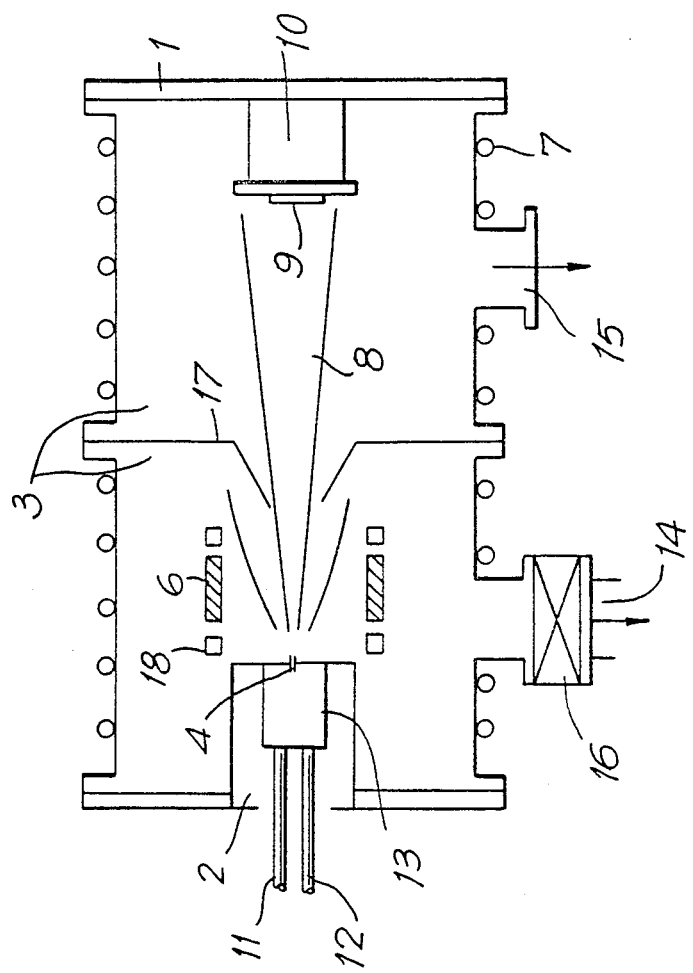
FIG. 1 shows a schematic longitudinal cross-section of the reactor according to the invention.

The embodiment of a reactor according to the invention shown in FIGS. 1 to 6 comprises a housing 1 which incorporates a chamber 2 in which a plasma-generator 13 (schematically illustrated in boxlike form) is accomodated together with a plasma-treatment chamber 3. A plasma-inlet 4 preferably incorporates a nozzle the end of which emerges into the treatment chamber 3. The generated plasma-jet 8 is directed to the surface 9 of the substrate to be treated and which substrate is held in place by a holder 10 which is maintained at a temperature in the range of 70° to 1000° Kelvin by means of a cooling-channel and/or built-in heating element (not shown in FIG. 1). The holder is also electrically insulated with respect to the housing 1 by which means it can form part of one or more extra discharges in the plasma treatment-chamber 3. In the case of a liquid or gas-like reactant being used, injection takes place in the plasma-generator 13 via the inlet 11 whilst the flushing-gas is injected via the inlet 12 in order to make (semi) continuous operation of the reactor possible. The flushing-gas can be composed of an arbitrary mixture of gases which do not give off any fragments after separation which could damage the parts of the plasma-generator 13 and such as inert gases, hydrogen and nitrogen for example. The ratio between the injected quantity of flushing-gas and reactant (expressed in m³/sec. at STP (standard temperature and pressure) gas equivalent i.e. 273° Kelvin and 2 bar, lies in the range 1 to 1000, preferably 8 to 400. The liquid or gas-like reactant is preferably composed of at least one separable and ionisable compound such as (possibly halogenated) hydrocarbons.

In order to operate a controlled plasma surface-treatment process without the presence of undesirable products in the plasma-jet 8, the process according to the invention is carried out whilst maintaining the pressure in the plasma-generator 13 above 0.1 bar., preferably in the range 0 to 3.5. The plasma-chamber 3 preferably operates at a pressure of below 0.05 bar (=5kPa) and particularly below 200 Pa independently of the settable pressure of the injected quantity of flushing-gas and/or reactant. These pressures can be achieved by pumping out the plasma treatment-chamber 3 via a regulating-valve 16 at the outlet 14 using for example a Roots-blower (not shown in FIG. 1) whilst via the outlet 15 an oil diffusion pump maintains the housing 1 at a low pressure ($10^{-3}$ Pa) when the reactor is not in use to prevent fouling up. A water-cooled skimmer 17 can possibly form a part of the plasma treatment-chamber 3 and through which the diameter of the plasma-jet 8 can be influenced. If required, the magnetic coils 7 can generate a magnetic-field which can again influence the diameter of the plasma-jet 8. Reactants in the form of solid matter are mixed with the plasma-jet 8 after they have been freed from the solid-phase by a sputtering discharge of which the cathode 6 (of copper for example) is the reactant and the anode 18 of which is electrically insulated from the housing 1.

Figure 2:
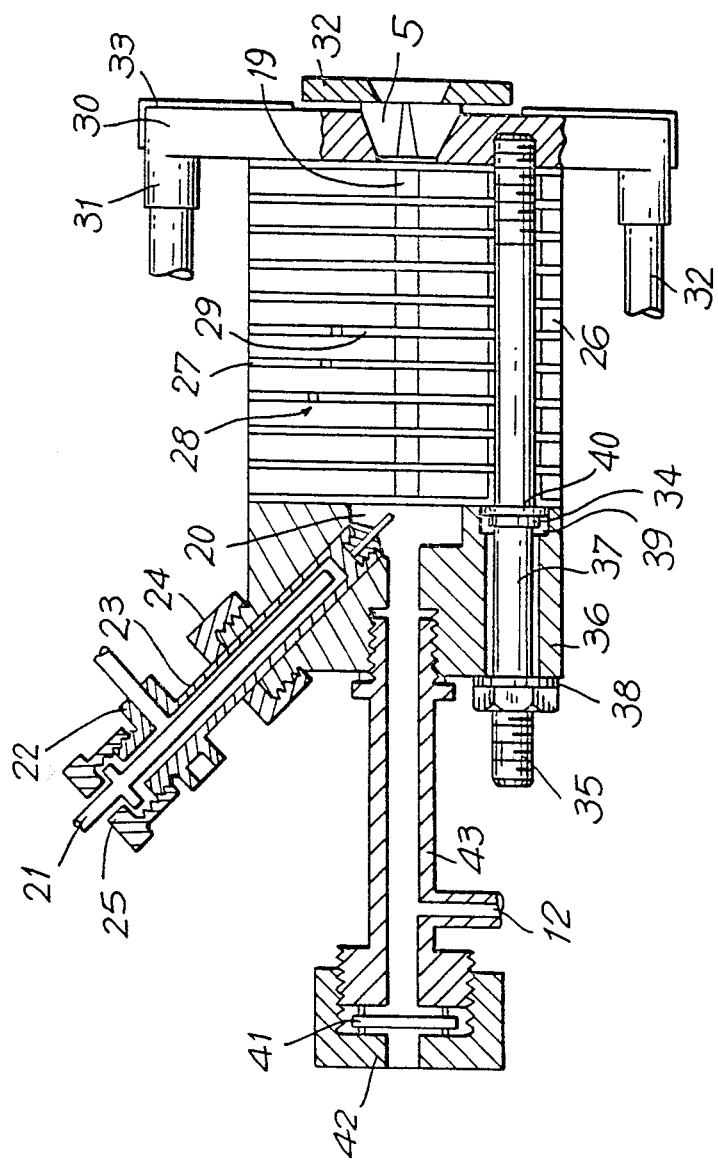
FIG. 2 shows a cascade-arc plasma generator.

As already stated herein, a high temperature plasma-jet is generated preferably in a cascade-arc. FIG. 2 shows in principle a construction which incorporates a central channel 19 with a length of 40 to 80 mm. and a diameter of 2 to 6 mm. for example through which, during operation, direct-current electricity of between 20 to 200 Amp. flows from the nozzle-like anode 5 to three cathode tips 20 (of which only one is shown in FIG. 2). The three cathode tips 20 made from an alloy of 2% thorium in wolfram are preferably arranged rotatively around the central channel 19 and are mounted in hollow holders 22 through which cooling water is fed through the duct 21. The holders 22 are at least partially enclosed in a sleeve 23 made for example from quartz and held in position by a screw 24 which accomodates a rubber ring (not shown in FIG. 2) and which clamps the holder 22 in a vacuumtight condition. The duct 21 is clamped tight in the holder 22 by a screw 25.

The voltage across the arc is between 20 and 200 volts for example and particularly in the range 50 to 150 volts. The initiation of plasma generation in the central channel 19 is achieved by reducing the arc pressure by applying approximately 1000 volts until flashover takes place and through which a large current flows (>10 Amp. for example). Hereafter the pressure is increased rapidly (within 5 seconds for example) until the desired value is reached and the arc is formed after all intermediate-discharge phases have occurred. The cascade-plates 26 made of copper for example are of simple design. Due to high temperatures (approx. 10000° Kelvin) and capacity-densities in the plasma, the plates must be cooled (by water for example). The channels for carrying the cooling liquid (not shown in FIG. 2) are closed at the central channel 19 introduced into the plates 19 and this arrangement ensures good heat-dissipation. The cascade-plates are separated from one another and electrically insulated by means of a sealing systems of '0' rings 27, spacers 28 (of PVC for example) and central rings 29 made of boron-nitride. The seals ensure that the arc can be maintained at pressures of between 0.05 and 5 bar. The central rings are white in colour and reflect the light radiating from the plasma. The object of the '0' rings is for them to act as protection against melting under the influence of plasma light absorption.

An anode 5 is located at the end of the channel 19 opposite the three cathodes 20. These comprise easily-removable conical inserts each of which is lightly pushed by a hold-down ring into a conical hole in a water-cooled plate (made of copper for example). Cooling-water is fed to this cooling-plate via the inlet 31 and discharged therefrom by the outlet 32. The quoted inserts are made from oxygen-free copper for example and are described in more detail with reference to FIG. 6. The plate 30 is electrically insulated from the housing 1 by an insulating sleeve 33.

A stack of for example 10 cascade-plates are affixed to the anode-plate 30 by a bolt 34 and a nut 35. The boat 34 is electrically insulated from the housing 1 by means of a sleeve 37, cap 39 and rings 38 and 40. The plasma is the central channel 13 can be observed through the window 41 of widow-cap 42 on the window-holder 43. The latter also incorporates the inlet 12 through which the flushing-gas is fed.

Figure 3:
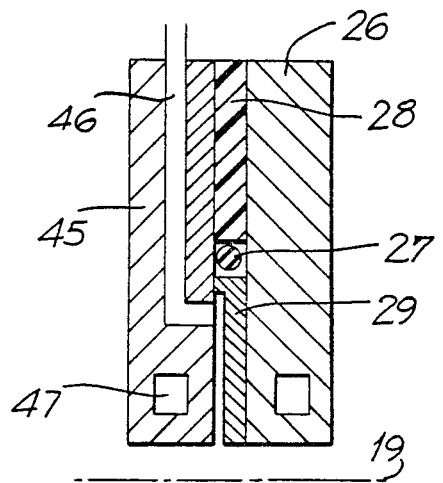
FIG. 3 shows a cross-section of an inlet for gas-like reactants into the cascade-arc described with reference to FIG. 2.

The inlet for gas-like reactants shown in FIG. 3 has already been described for the greater part since it comprises two oppositely arranged surfaces of two adjoining cascade-plates 26 and 45 of which at least one plate 45 is provided with a channel 46 through which the gas-like reactant can be injected into the central channel 19 via a recess measuring 0.1 mm. for example in the central boron-nitride ring 46. Channel 46 is arranged such that it makes no contact with the cooling-channel 47.

Figure 4:
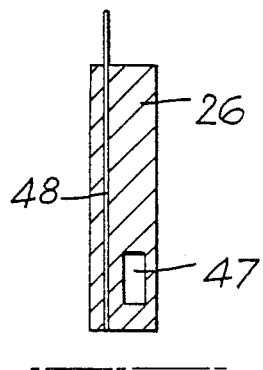
FIG. 4 shows how liquid reactants are injected into the cascade-arc shown in FIG. 2.

The inlet shown in FIG. 4 for the injection of the liquid reactants into the channel 19 comprises at least one capillary 48 fitted to the cascade-plate 26 such that the cooling-channel 47 is not touched. The diameter of this capillary must be chosen such that liquid fed at a higher pressure than that prevailing in the plasma-channel 19 is only vaporised at the end of the capillary where it emerges into the central channel 19.

The possibly used auxiliary discharge shown in FIG. 5 comprising a cathode 51 which in turn comprises the reactant if the latter is of solid matter, is electrically-insulated from the housing shown in FIG. 1 as in the case of anode 50, it is provided with a cooling-channel 52 and is located at a certain distance (10 cm. for example) from the symmetrical-axis of the plasma-jet shown in FIG. 1.

If this discharge is energised by a voltage of between 200 and 1000 volts for example and with a current density of between 50 and 1000 Ma/cm² then the reactant material is made gas-like (by sputtering for example) and mixes with the plasma-jet.

FIG. 6 shows an example of the construction of a supersonic nozzle which can be used to prevent the deposition of material on undesirable places in the plasma generator. The insert 52 is pressed into the anode-plate 30 by the hold-down ring 32 in connective engagement with the last cascade-plate 26 and the last boron-nitride ring 29. Initially, the hole in the insert 52 has a diameter which is greater than the diameter of the central channel 19, and thereafter it increases so that the channel emerges at an angle of more than 10 degrees for example with respect to the symmetrical-axis of the central channel 19. The inner wall 53 of the insert 52 needs to be finished-off smooth (with a surface-roughness of less than 0.1 microns).

Preferably the complete cascade-arc plasma-generator should be connected to relatively large vacuum-system so that the plasma can be extracted for the anode-nozzle 5. The pump speed needs to be chosen such that the expansion in the sub-atmospheric plasma treatment-chamber 3 assumes a supersonic character. In such a case the equilibrium of the arc-plasma will be 'frozen-in'. Three-particle and radiation-recombination processes are too long to allow a substantial reduction of the number of reactive plasma-particles to arise before reaching the substrate to be treated. Because both the gas and elecron temperatures in the arc-plasma have a value of approximately 10000° Kelvin the sound-speed is 1750 meter/per second. This fact limits the mass-flow, there the sound-speed is reached at the point with smallest diameter (in the majority of cases this is at the nozzle or at the end of the arc-channel).

Alongside supersonic expansion, another effect arises insofar that the efficiency of the process is greatly strengthened. Since the electrons have a greater degree of mobility than the ions they will easily migrate to the outermost regions of expansion. Through this, such a spatial-discharge distribution is created in a situation of equilibrium that the resulting electric-field strength retards the electron flow to such an extent that they will diffuse at the same rate as the ions (ambipolar-diffusion concept). In combination with the high systematic gas speed in the supersonic expansion, the electrons hold the plasma together so that an intense plasma-jet exists. The ionisation-equilibrium in the arc-plasma will now be transported in an efficient manner to the substrate to be treated. The neutral particles can now easily expand and a number of them will never reach the substrate 9.

Because the time needed by the reactive particles after extraction from the plasma-generator to cross over to the substrate is only 1 millisecond approximately, it is unlikely that the relative composition of the plasma-jet changer through recombination or through other associated processes.

We claim:

1. A method of treating the surfaces of substrates with the aid of a plasma, comprising the steps:
    (a) supporting a substrate in a plasma treatment chamber,
    (b) providing at least one plasma-generator connected by at least one plasma-inlet to the plasma treatment chamber,
    (c) introducing a reactant via at least one inlet into said plasma-generator,
    (d) generating a plasma in said plasma-generator,
    (e) maintaining in the treatment chamber a pressure lower than that in the said plasma-generator whereby a stream of plasma flows through the plasma-inlet from the said plasma-generator to the said plasma treatment chamber, and
    (f) flushing through the plasma-generator a flushing gas.

2. A method as set forth in claim 1 wherein, during the treatment of the substrate, forming an extra discharge in the plasma treatment chamber using the substrate as an electrode.

3. A method as claimed in claim 1, wherein the plasma-generator contains cathode and anode electrodes, the reactant is gas-like or liquid, and the reactant is first fed upstream in the plasma-generator after the flushing gas has passed the cathode.

4. A method as claimed in claim 3, wherein the flushing gas is built-up of molecules which contain no fragments which would react with the material of the cathode.

5. A method as claimed in claim 1, wherein the flushing gas is flowed through the plasma-generator at a rate of at least 1 meter/second in order to retard or prevent back-diffusion of the reactant.

6. A method as claimed in claim 5 wherein the flushing gas flow rate is at least 10 meters/second.

7. A method as claimed in claim 3 wherein during the treatment, the temperature of the cathode is maintained below the melting temperature of the cathode.

8. A method as claimed in claim 1 wherein the reactant is a liquid and is injected into the plasma-generator through at least one aperture in its wall with a diameter of between 0.0001 and 0.5 mm.

9. A method as claimed in claim 8, wherein the wall aperture has a diameter of between 0.005 and 0.1 mm.

10. A method as claimed in claim 8, wherein the liquid pressure in front of the aperture is maintained at a pressure greater than the pressure in the plasma-generator.

11. A method as claimed in claim 1, wherein the reactant is in the form of solid matter, and at least one discharge is established in the plasma treatment chamber or in the plasma-generator and which converts reactant into a gas-like phase.

12. A method as claimed in claim 1, wherein the treatment chamber is pumped out at a rate which is adjustable between 0 and 100,000 liters/second.

13. A method as claimed in claim 12, wherein the pumping rate is between 50 and 1000 liters/second.

14. A method as claimed in claim 1, wherein the diameter of the stream of plasma flowing into the treatment chamber is controlled.

15. A method as claimed in claim 14, wherein the plasma stream diameter is controlled by passing the plasma stream through a skimmer.

16. A method as claimed in claim 14, wherein the plasma stream diameter is controlled by subjecting it to a magnetic field.

17. A method as claimed in claim 1, wherein the reactant introduced to the plasma-generator in the vicinity of the plasma-inlet.

18. A method as claimed in claim 1, wherein the substrate is maintained at a temperature of between 70° and 1500° Kelvin.

19. A method as claimed in claim 18, wherein the temperature is maintained at between 273° and 1000° Kelvin.

* * * * *